US012696719B2

(12) United States Patent (10) Patent No.: US 12,696,719 B2
Chiu et al. (45) Date of Patent: Jul. 28, 2026

(54) SUBSTRATE CONTAINER EQUIPPED WITH STABILIZING SUPPORT AND SMOOTH TRAY CONNECTION

(71) Applicant: GUDENG PRECISION INDUSTRIAL CO., LTD., New Taipei (TW)

(72) Inventors: Ming-Chien Chiu, New Taipei (TW);
Chia-Ho Chuang, New Taipei (TW);
Kuo-Hua Lee, New Taipei (TW);
En-Nien Shen, New Taipei (TW);
Jyun-Ming Lyu, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 241 days.

(21) Appl. No.: 18/214,637

(22) Filed: Jun. 27, 2023

(65) Prior Publication Data

US 2024/0006212 A1 Jan. 4, 2024

Related U.S. Application Data

(60) Provisional application No. 63/357,011, filed on Jun. 30, 2022.

(51) Int. Cl.
| | |
|---|---|
| *B65D 25/10* | (2006.01) |
| *B65D 25/24* | (2006.01) |
| *B65D 85/30* | (2006.01) |
| *B65D 85/38* | (2006.01) |
| *H10P 72/10* | (2026.01) |

(52) U.S. Cl.
CPC ........ *H10P 72/1921* (2026.01); *B65D 25/107* (2013.01); *B65D 25/24* (2013.01); *B65D 85/307* (2013.01); *B65D 85/38* (2013.01)

(58) Field of Classification Search
CPC .... B65D 25/24; B65D 25/107; B65D 85/307; B65D 85/38; H01L 21/67383
USPC .................................................. 206/711, 454
See application file for complete search history.

(56) References Cited

U.S. PATENT DOCUMENTS

| | | | | |
|---|---|---|---|---|
| 8,910,792 B2 * | 12/2014 | Nagashima | ....... | H01L 21/67369 206/711 |
| 9,312,157 B2 * | 4/2016 | Adams | ............. | H01L 21/67369 |
| 9,633,877 B2 * | 4/2017 | Gregerson | ........ | H01L 21/67383 |
| 9,698,033 B2 * | 7/2017 | Matsutori | ......... | H01L 21/67376 |

(Continued)

FOREIGN PATENT DOCUMENTS

| | | |
|---|---|---|
| JP | 2520919 B2 | 7/1996 |
| JP | 2016119408 A | 6/2016 |

(Continued)

*Primary Examiner* — Steven A. Reynolds

(74) *Attorney, Agent, or Firm* — Troutman Pepper Locke LLP; Tim Tingkang Xia, Esq.

(57) ABSTRACT

The invention discloses a substrate container which includes at least one support for substrates. The support has plural ribs distantly separated with each other. The ribs define multiple slots and a carrying plane for receiving a substrate. Each of the ribs has a front end and a rear end. Rear ends of two neighboring ones of the ribs are connected by a closing portion, so that the rear end of a slot defined by the two neighboring ones of the ribs is closed. The closing portion has a concave surface. The concave surface and the carrying plane define a clamping position for substrate confinement.

6 Claims, 15 Drawing Sheets

(56)          References Cited

U.S. PATENT DOCUMENTS

| 10,475,682 | B2 * | 11/2019 | Fuller | ............... | H01L 21/67383 |
| 2018/0182655 | A1 * | 6/2018 | Yokoyama | ........ | H01L 21/67383 |
| 2020/0051841 | A1 * | 2/2020 | Sato | ................. | H01L 21/67379 |

FOREIGN PATENT DOCUMENTS

| KR | 100460309 | B1 | 12/2004 |
| TW | 202144266 | A | 12/2021 |

* cited by examiner

SUBSTRATE CONTAINER EQUIPPED WITH STABILIZING SUPPORT AND SMOOTH TRAY CONNECTION

CROSS-REFERENCE TO RELATED APPLICATION(S)

This application claims the benefits of U.S. Provisional Application Ser. No. 63/357,011 filed on Jun. 30, 2022. The content of the application above is expressly incorporated by reference herein in its entirety.

BACKGROUND OF THE INVENTION

Field of the Invention

The present disclosure relates to substrate containers or wafer containers, and more particularly to a substrate container equipped with an anti-slip tray with enhanced stability.

Description of the Prior Art

With semiconductor substrate (for example, wafer) dimensions being on the rise, not only does density of distribution of circuits formed on semiconductor substrates increase, but the circuits are also likely to end up with defects because of particles and other contaminants. Furthermore, both substrate weight and substrate container dimensions increase with substrate dimensions. Thus, the likelihood of production of particles increases when the substrate and the substrate container collide. The increase in substrate dimensions and weight necessitates a boost to the stability of support given to the substrate container. It is necessary to improve the substrate container in order to reduce a chance of contamination of large-dimension substrate containers.

Furthermore, a friction area between each existing substrate container and a loading interface of a loading apparatus is large and thus causes excessive adhesion between the substrate container and the loading interface, deteriorating ease of loading and unloading the substrate container. Therefore, if a design of existing loading apparatuses remains unchanged, it will be necessary to improve existing substrate containers.

SUMMARY OF THE INVENTION

The disclosure provides a substrate container comprising: a casing having a sidewall; and at least one support connected to the sidewall of the casing and having a plurality of ribs spaced apart from each other, the plurality of ribs defining a plurality of slots and a carrying plane for receiving a substrate. The plurality of ribs each has a front end and a rear end. The rear ends of every adjacent two of the ribs are connected by a closing portion to allow the slots defined by every adjacent two of the ribs to be closed at the rear ends. The closing portion has a concave surface, and a clamping position for restraining the substrate to is defined between the concave surface and the carrying plane.

In a specific embodiment, the clamping position allows the concave surface to at least restrain an upper edge of a substrate, and the carrying plane supports a bottom of the substrate, allowing the substrate to be held in place.

In a specific embodiment, the clamping position allows the concave surface to restrain upper and lower surfaces of a substrate, and the carrying plane supports a bottom of the substrate, allowing the substrate to be held in place.

In a specific embodiment, the concave surface is defined by a first slope and a second slope which are linked, whereas the first slope and the second slope define a concave included angle.

In a specific embodiment, the two adjacent ribs are an upper rib and a lower rib, allowing bottoms of the upper ribs, tops of the lower ribs and the concave surfaces to define the slots.

In a specific embodiment, the bottom of the upper rib has a guide slope, and the guide slope is linked to the first slope of the concave surface of the closing portion.

The disclosure further provides a substrate container comprising a casing; and a tray detachably connected to a bottom of the casing, such that the casing is able to be placed on a loading interface of a loading apparatus through the tray. The tray has a top, a bottom and a guide hole. The top of the tray has a guide surface defined proximate to the guide hole and is configured to receive a restriction mechanism from the loading interface. The guide surface has a texture formed thereon and is adapted for reducing friction between the guide surface and the restriction mechanism.

In a specific embodiment, the guide hole is a rectangular guide hole penetrating the top and the bottom of the tray, with the top having a flange, the flange extending along four sides of the guide hole and having the guide surface.

In a specific embodiment, the guide surface has a slope adjoining a rim of the guide hole.

In a specific embodiment, the tray further has three positioning slots symmetrically disposed on the bottom of the tray, and the guide hole is disposed between symmetric two of the three positioning slots.

The aforesaid aspects and other aspects of the disclosure are illustrated by non-restrictive specific embodiments, depicted by accompanying drawings and described below.

BRIEF DESCRIPTION OF THE DRAWINGS

The disclosure is depicted by drawings, illustrated by non-restrictive, non-exhaustive embodiments, and described below. The drawings are not drawn to scale but are aimed at disclosing the structural features and principles of the disclosure.

DETAILED DESCRIPTION OF THE EMBODIMENTS

The disclosure is depicted with accompanying drawings, illustrated with specific exemplary embodiments, and described below. A claimed subject matter of the disclosure can be implemented in plenty different specific ways, and thus the construction for including or claiming the claimed subject matter is not restricted to any specific illustrative, exemplary embodiments of the disclosure. Likewise, the disclosure is aimed at providing the reasonable scope for the claims for claiming or including the claimed subject matter. In addition, for example, the claimed subject matter may be specifically implemented in the form of a method, device or system.

The expression "an embodiment" used herein does not necessarily refer to the same specific embodiment. Likewise, the expressions "another embodiment," "some embodiments" and "other embodiments" used herein do not necessarily refer to different specific embodiments. Therefore, for example, the claimed subject matter falls within the scope of a combination of exemplary, specific embodiments, in whole or in part.

As mentioned before, substrate weight increases with substrate dimensions. Thus, it is necessary to boost stability capability of a substrate container with a view to meeting the requirements of the substrates.

Figure 1:
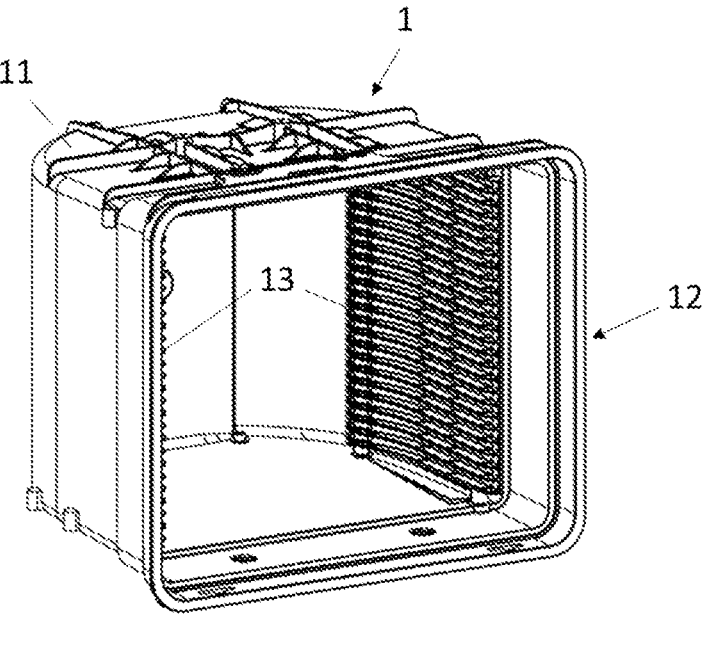
FIG. 1 is a perspective view of a substrate container according to an embodiment of the disclosure.
Figure 2:
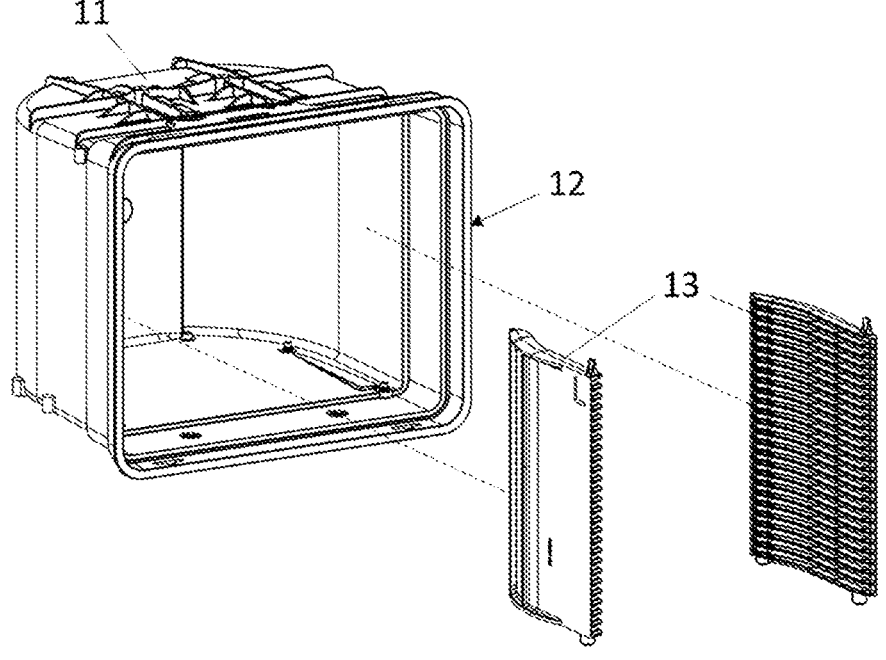
FIG. 2 is an exploded view of the substrate container according to the embodiment of the disclosure.

FIG. 1 is a perspective view of a substrate container (1) according to an embodiment of the disclosure. FIG. 2 is an exploded view of the substrate container (1) according to the embodiment of the disclosure.

The substrate container (1) comprises a casing (11) and a door (not shown) coupled to the casing (11). The casing (11) essentially comprises a top, a bottom, a pair of sidewalls and a rear wall and defines a receiving space for receiving a plurality of internal elements and a plurality of substrates. The top, bottom and the sidewalls of the casing (11) define an opening (12) anteriorly located and adapted to allow a front end of a robotic arm to enter and exit the receiving space in order to access a substrate. The substrate container (1) comprises a pair of supports (13) detachably connected to inner sides of the sidewalls and adapted to define a plurality of slots for receiving a plurality of substrates.

In addition to constituent components shown in FIG. 1 and FIG. 2, the substrate container (1) actually further comprises other constituent components. For example, the top provides a coupling structure operating in conjunction with an overhead hoist transport (OHT). A gas diffusion tower for supplying a gas to the receiving space is mounted in place at the bottom. An evacuation channel is formed near the opening (12) to enable evacuation. One or more gas feeding modules and evacuation modules are mounted in place at the bottom and are in communication with the gas diffusion tower and the evacuation channel, respectively. Furthermore, the door has a latch mechanism operating in conjunction with a hole near the opening (12) and adapted to allow the door to be coupled to the casing (11).

Figure 3A:
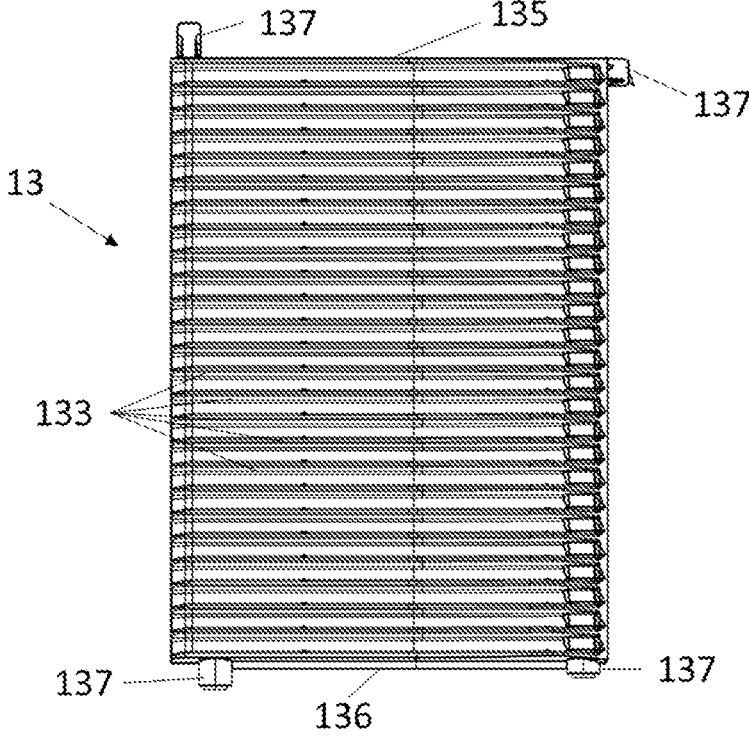
FIG. 3A and FIG. 3B are a front view and a rear view of a support of the disclosure, respectively.
Figure 3B:
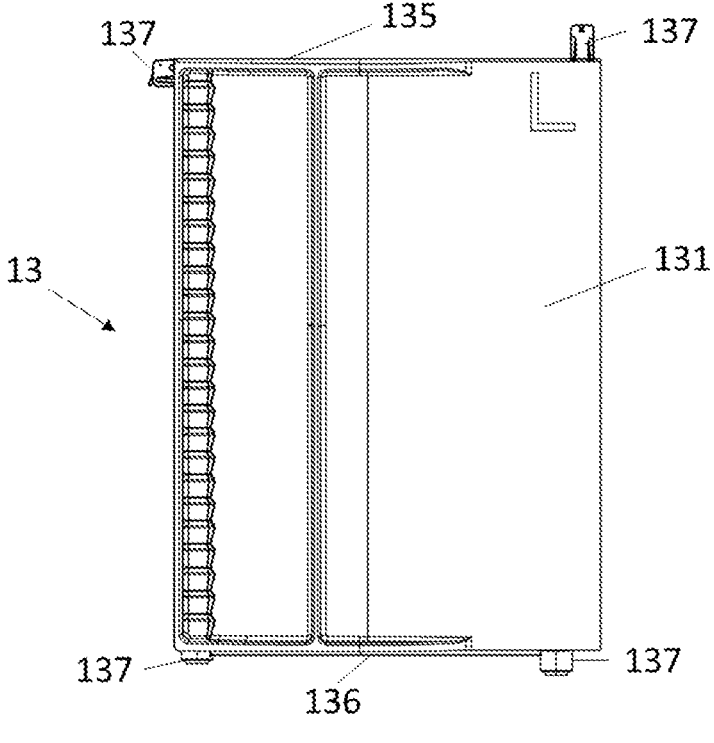
Figure 4A:
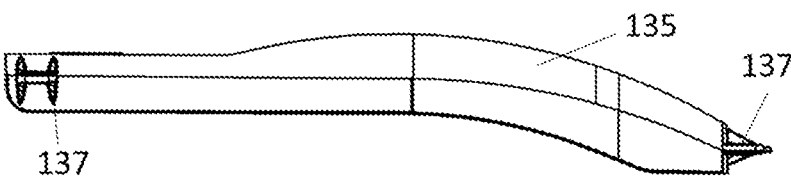
FIG. 4A, FIG. 4B and FIG. 4C are a top view, a left side view and a right side view of the support of the disclosure, respectively.
Figure 4B:
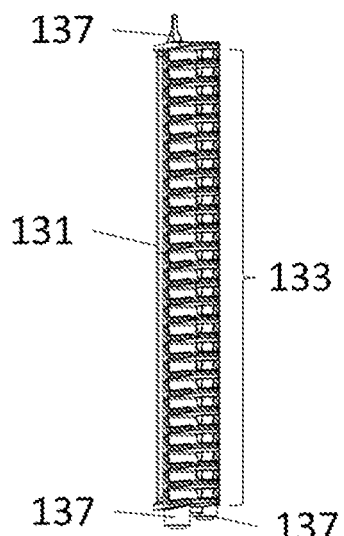
Figure 4C:
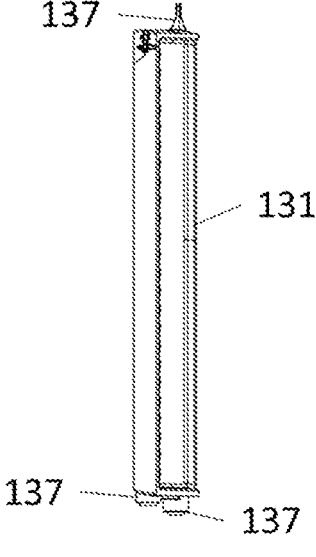

FIG. 3A and FIG. 3B are a front view and a rear view of a support (13) of the disclosure, respectively, especially the support (13) on the left as shown in FIG. 2. FIG. 4A, FIG. 4B and FIG. 4C are a top view, a left side view and a right side view of the support (13) of the disclosure, respectively. The support (13) comprises a continuous wall (131). As shown in FIG. 3A, the continuous wall (131) is shaped according to a shape of the sidewalls of the casing (11) and thus bent slightly, and an outer surface of the continuous wall (131) can be seamlessly attached to the sidewalls of the casing (11). The continuous wall (131) has a height extending between the top and the bottom of the casing (11) and a length extending between the rear side and the opening (12). The continuous wall (131) has a top (135) and a bottom (136) that function as upper and lower boundaries of the support (13). The support (13) has a plurality of ribs (133) each having a continuous structure and extending horizontally between the top and the bottom of the continuous wall (131). The plurality of ribs (133) is spaced apart at predetermined intervals and disposed on the inner surface of the continuous wall (131). Furthermore, the support (13) further comes with a plurality of positioning components (137) on the top (135) and the bottom (136), respectively, such that the support (13) is confined to and positioned on the sidewalls of the casing (11). The support (13) is formed integrally or formed by fitting a plurality of components together.

FIG. 5A to FIG. 5D are partial enlarged views of the support (13) of the disclosure, especially the support (13) on the right as shown in FIG. 2. Ends of the ribs (133) are connected to each other and thus are closed. Other ends of the ribs (133) are unconnected and thus are open. A slot (5) and a carrying plane are defined between every two adjacent ribs (133) to receive one substrate. Every two adjacent ribs (133) are spaced apart by an appropriate distance to allow the substrate to enter and exit the slot (5) at the open end of the two adjacent ribs (133). The carrying plane is a top structure of a lower rib (133) of every two adjacent ribs (133) and is adapted to support the bottom of the substrate.

Figure 5A:
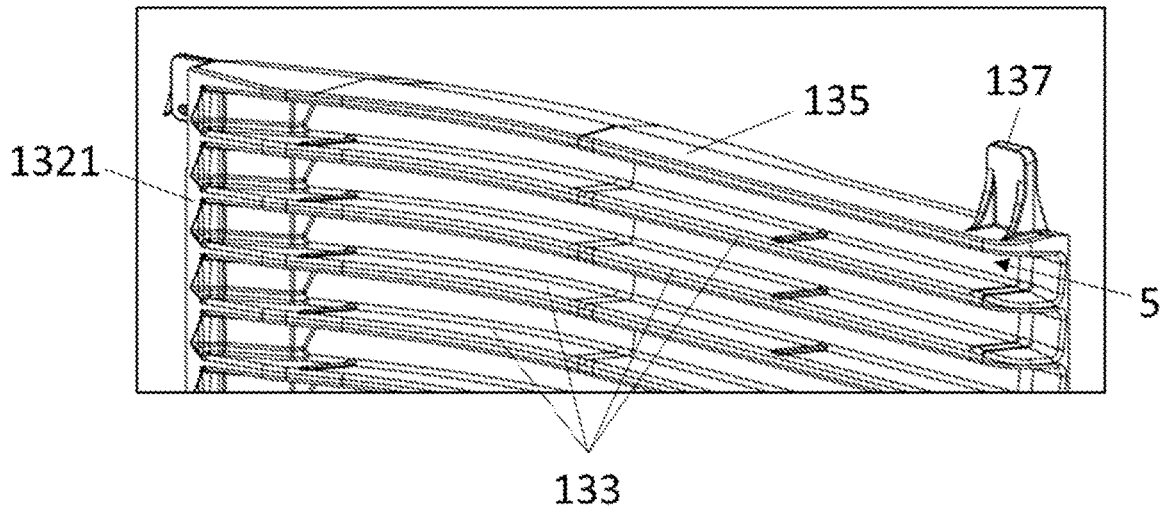
FIG. 5A to FIG. 5D are partial enlarged views of the support of the disclosure.
Figure 5B:
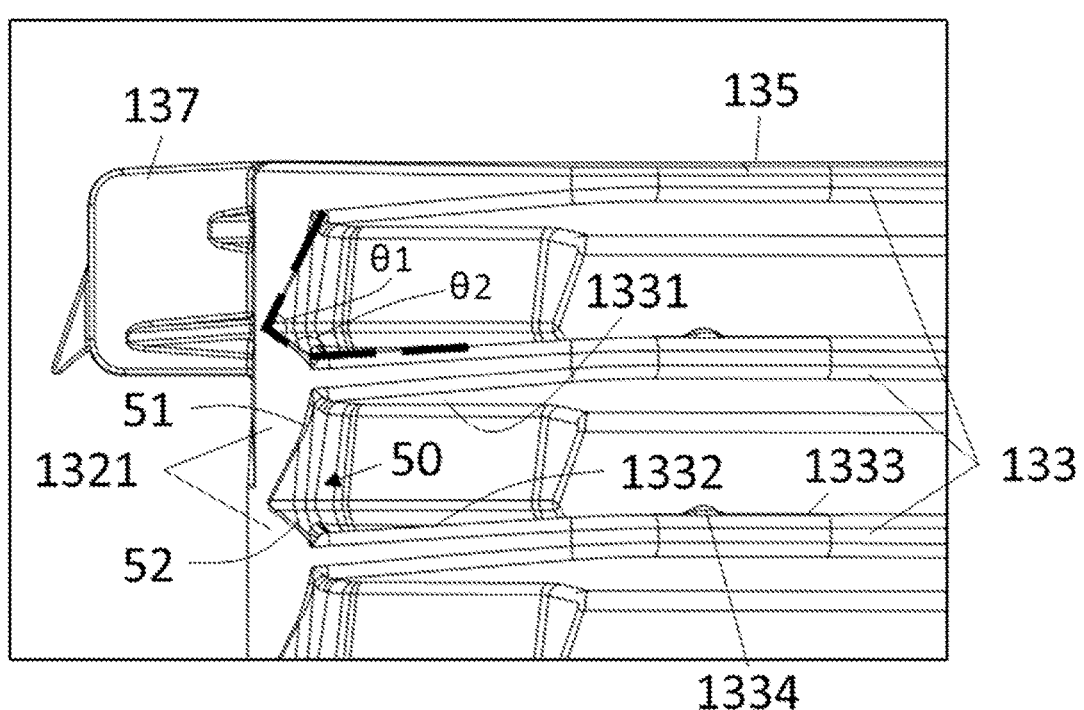
Figure 5C:
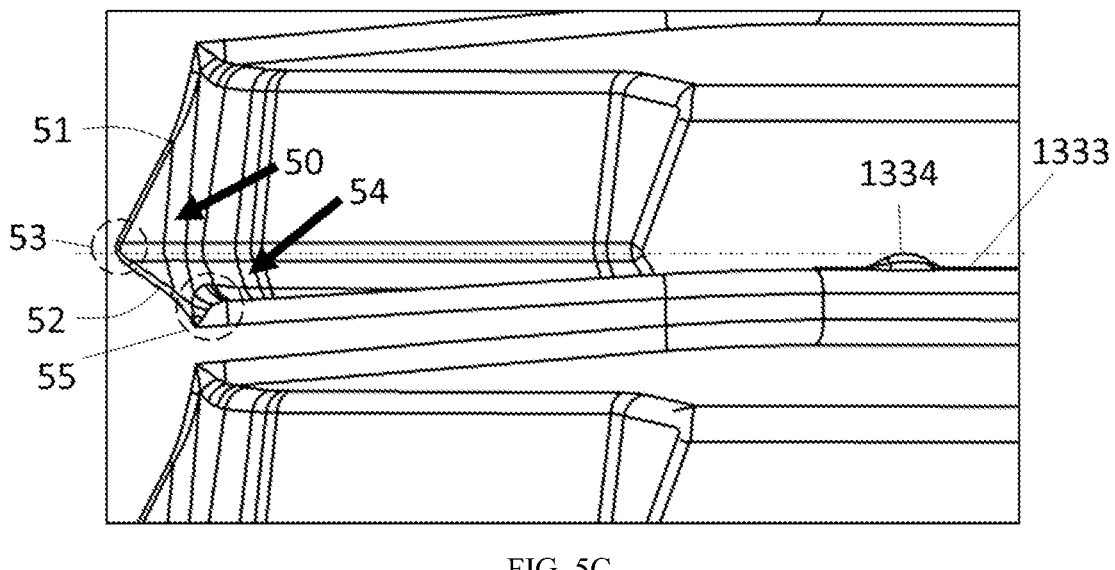

FIG. 5B shows a continuous closing portion (1321). Each closing portion (1321) connects two ends of two adjacent ribs (133), and thus the end of the slot (5) is closed. The edge of the substrate received in the slot (5) is confined to between the closing portion (1321) and two adjacent ribs (133). As shown in FIG. 5C, the closing portion (1321) has a concave surface (50). The concave surface (50) is defined by a first slope (51) and a second slope (52). The first slope (51) is linked to a guide slope (1331) at the bottom of the upper rib (133). The second slope (52) is linked to a descending slope (1332) of the top of the lower rib (133).

As shown in FIG. 5C, the concave surface (50) defined by the first slope (51) and the second slope (52) has a concave peak (53). The concave peak (53) is substantially at the equal height (as indicated by a dashed line) as the carrying plane of the top of the lower rib (133), i.e., a bump (1334) formed on a plane (1333); thus, the lateral sides (including the edge and upper and lower surfaces) of the substrate not only abut against the concave peak (53) of the concave surface (50), but are also restrained and clamped by the first slope (51) and the second slope (52). The bump (1334) on the carrying plane supports the bottom of the substrate. In another embodiment, the concave peak (53) is slightly lower than the plane (1333) or the bump (1334) such that the upper edge of the substrate is restrained by the first slope (51) when the edge of the substrate abuts against the concave surface (50), allowing the bump (1334) on the carrying plane to support the bottom of the substrate and the substrate to get held in place because of the interaction between the first slope (51) and the bump (1334) on the plane (1333). In some embodiments, the bump (1334) is dispensable. The advantage of keeping the concave peak (53) and the plane (1333) or the bump (1334) at the same height is to allow the edge of the substrate to stay horizontal while being clamped by the first slope (51) and the second slope (52), otherwise the bottom of the substrate will not be attached to the plane (1333) but will be hanging.

The guide slope (1331) of the upper rib (133) guides the movement of the edge of the substrate toward the concave surface (50). A sink (54) is formed from the descending slope (1332) of the lower rib (133) and the second slope (52) to reduce the chance that the lower edge of the substrate will be hit in the course of movement. As shown in FIG. 5C, the sink (54) formed from the descending slope (1332) and the second slope (52) has a valley peak (55). The valley peak (55) is lower than the concave peak (53) on the concave surface (50); in other words, the valley peak (55) is lower than a top plane (1333) of the lower rib (133). In the embodiment, the first slope (51) and the second slope (52) define a concave included angle (θ1), whereas the second slope (52) and the descending slope (1332) define a sink included angle (θ2), wherein θ2 is greater than θ1. However, the disclosure is not limited thereto. In another possible embodiment, the first slope (51), the second slope (52), the guide slope (1331) and the descending slope (1332) are curved, and thus the concave included angle (θ1) and the sink included angle (θ2) cannot be clearly defined, but the valley peak (55) of the sink (54) is still lower than the concave peak (53) of the concave surface (50), preventing the lower edge of the substrate from being hit and producing particles.

Figure 5D:
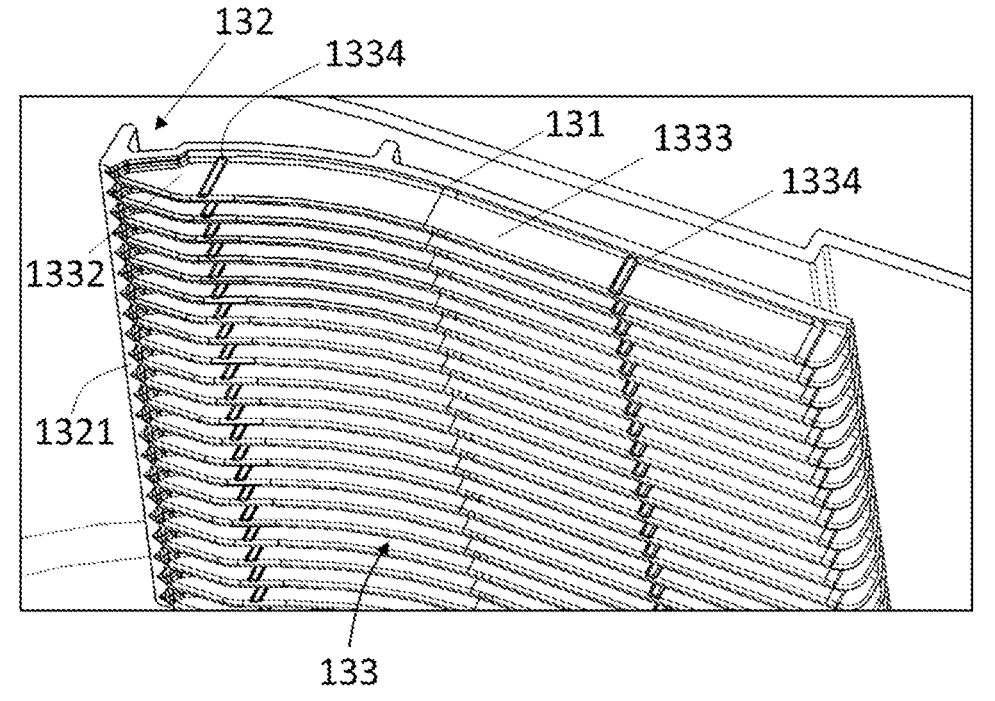

The first slope (51) is linked to the guide slope (1331) of the bottom of the upper rib (133). The second slope (52) is linked to the descending slope (1332) of the top of the lower rib (133) to define a clamping range. FIG. 5D shows that the outer surface of the continuous wall (131) has a plurality of dent portions (132) each corresponding in position to the clamping range. This structural design is aimed at keeping a wall thickness of the continuous wall (131) constant and thereby allowing the plurality of ribs (133) to bear the substrate weight as usual.

Figure 6:
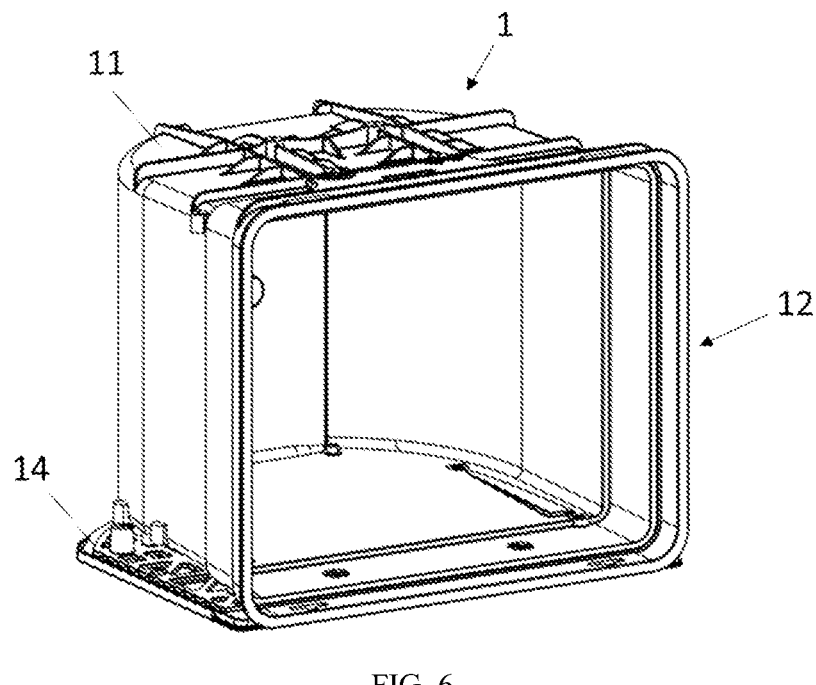
FIG. 6 is a perspective view of a substrate container according to another embodiment of the disclosure.
Figure 7:
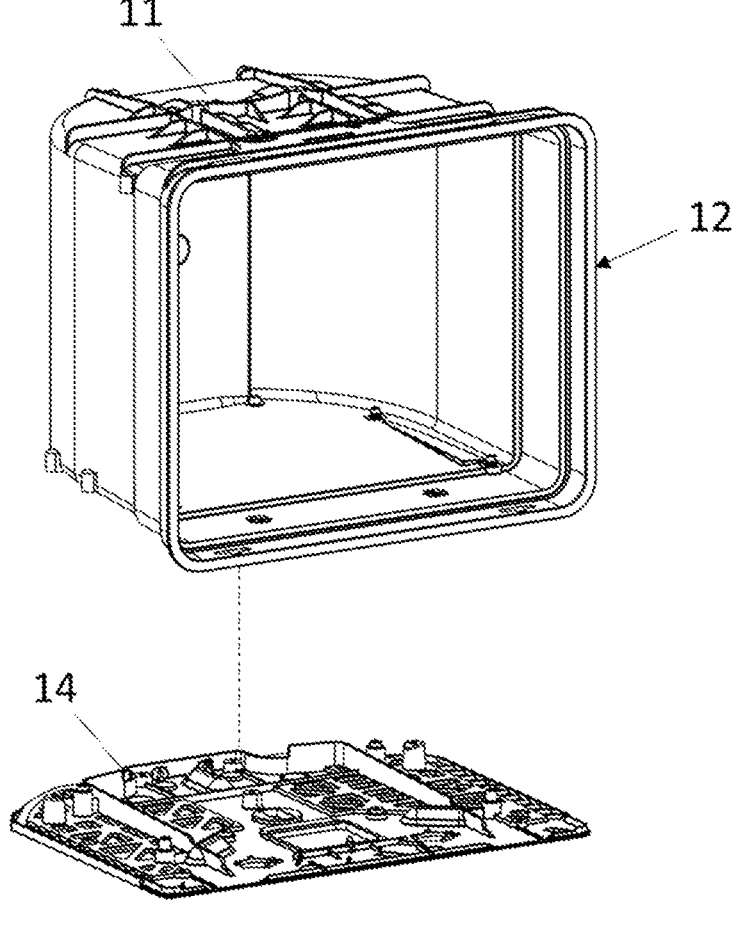
FIG. 7 is an exploded view of the substrate container according to the another embodiment of the disclosure.

FIG. 6 is a perspective view of a substrate container (1) according to another embodiment of the disclosure. FIG. 7 is an exploded view of the substrate container (1) according to the embodiment of the disclosure.

The substrate container (1) comprises a casing (11) and a door (not shown) coupled to the casing (11). The casing (11) essentially comprises a top, a bottom, a pair of sidewalls and a rear wall and defines a receiving space for receiving a plurality of internal elements and a plurality of substrates. The top, the bottom and the sidewalls of the casing (11) define an opening (12) anteriorly located and adapted to allow the front end of a robotic arm to enter and exit the receiving space in order to access a substrate. The substrate container (1) further comprises a tray (14) detachably connected to the outer side of the bottom and adapted to function as a base for the substrate container (1).

Figure 8:
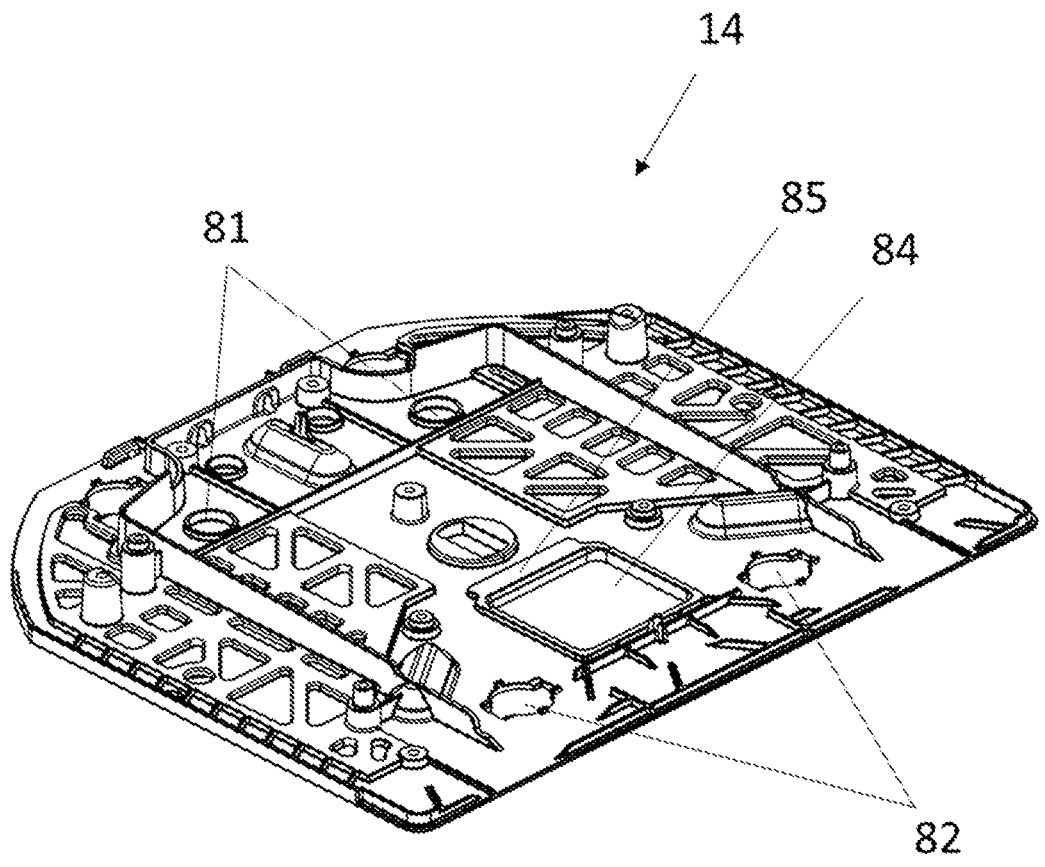
FIG. 8 is a perspective view of a tray of the disclosure.
Figure 9A:
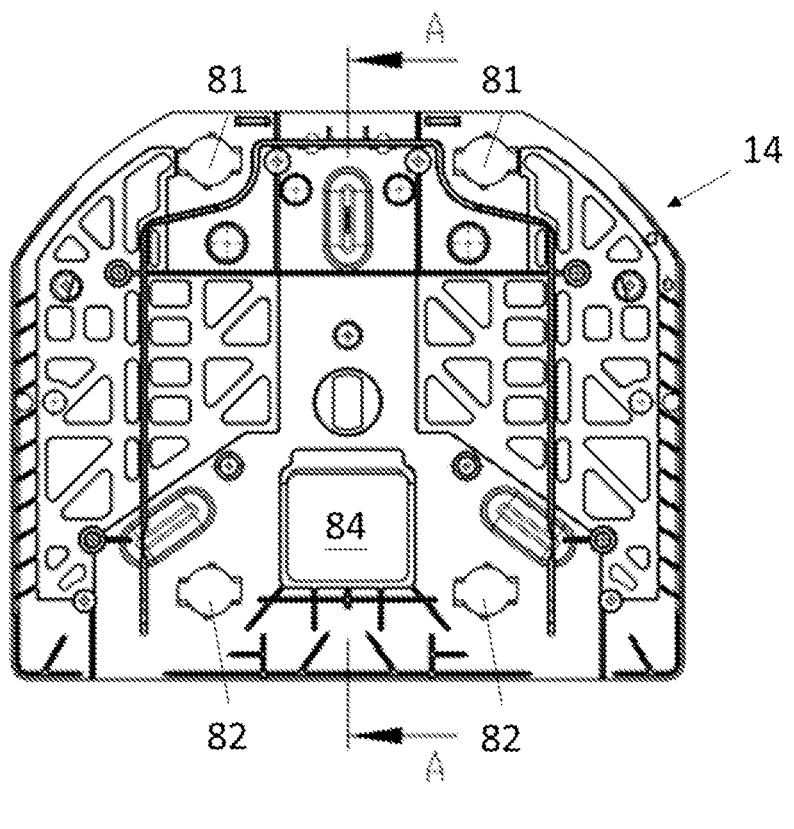
FIG. 9A and FIG. 9B are a top view and a bottom view of the tray of the disclosure, respectively.
Figure 9B:
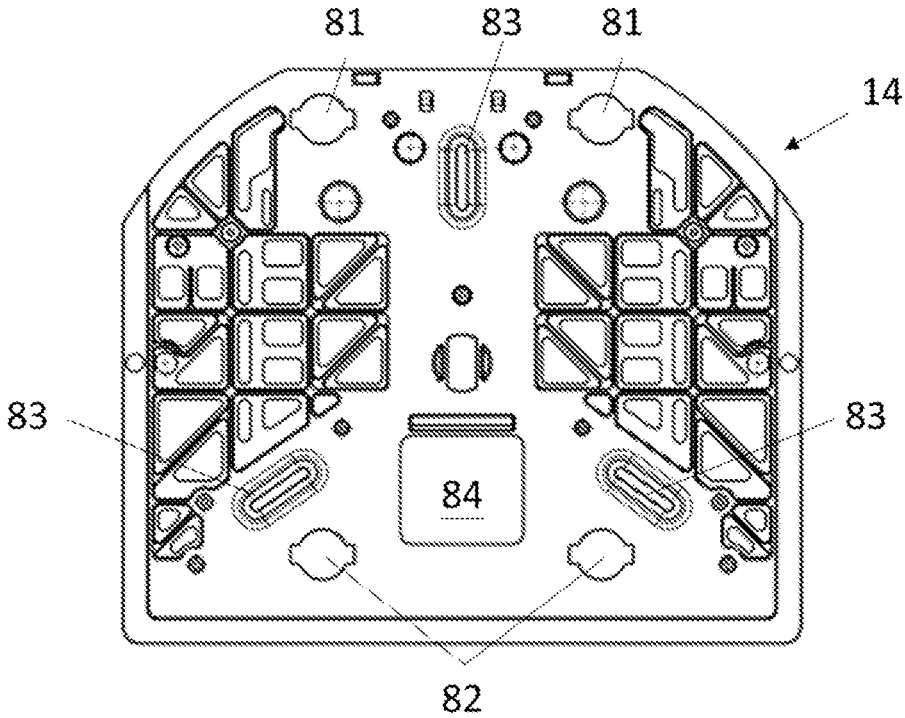

FIG. 8 is a perspective view of the tray (14). FIG. 9A and FIG. 9B are a top view and a bottom view of the tray (14), respectively. The tray (14) is basically a board, with its top essentially comprising an element required for connection to the bottom of the substrate container (1), its bottom essentially comprising an element required for connection to a loading apparatus. For example, two round holes (81) for use with a gas feeding module (not shown) are disposed at a rear end of the tray (14), and two round holes (82) for use with an evacuation module (not shown) are disposed at a front end of the tray (14). A gas supply nozzle and an evacuation port, both disposed on the loading apparatus, are connected to a gas feeding module and an evacuation module at the bottom of the substrate container (1) through the round holes (81) at the rear end and the round holes (82) at the front end, respectively, to carry out gas operation.

As shown in FIG. 9B, three positioning slots (83) are symmetrically disposed on the bottom surface of the tray (14). One of the positioning slots (83) is positioned proximate to the round holes (81) at the rear end, and the other two positioning slots (83) are positioned proximate to the round holes (82) at the front end. A loading interface of an apparatus platform has a plurality of positioning pins operating in conjunction with the positioning slots (83) to allow the substrate container (1) to be positioned on the loading interface.

As shown in FIG. 9A, the top of the tray (14) has a guide hole (84). The guide hole (84) is designed to operate in conjunction with a restriction mechanism (not shown) provided by the loading interface of the loading apparatus, as further described later. The restriction mechanism enters the tray (14) from the loading interface through the guide hole (84) and holds the tray (14) in place by means of engagement, compression, catching or attraction. The guide hole (84), which is rectangular in shape, is located between the round holes (82) at the front end or between two symmetrical positioning slots (83), but the disclosure is not limited thereto (for example, allowing the guide hole (84) to be altered according to the design of the loading interface). As shown in FIG. 8, a flange or protrusion is disposed at the rim of the guide hole (84), and the flange has a guide surface (85). The guide surface (85) is a slender surface and adjoins a rectangular margin of the guide hole (84), especially a rectangular margin near the center of the tray (14), but the disclosure is not limited thereto.

Figure 10A:
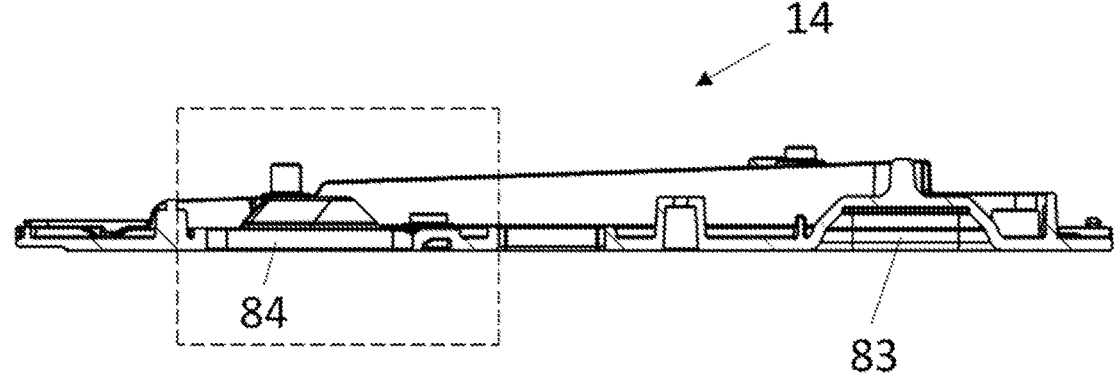
FIG. 10A is a cross-sectional view of the tray taken along line A-A of FIG. 9A.
Figure 10B:
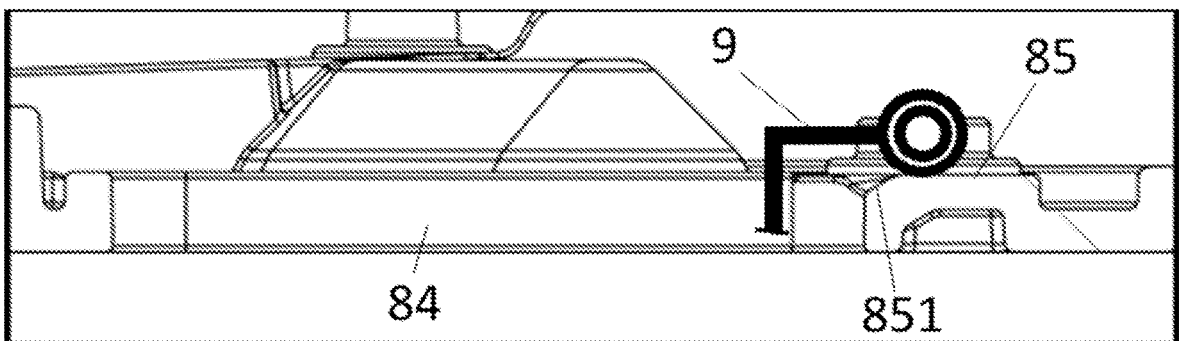
FIG. 10B is a partial enlarged view of FIG. 10A.

The guide surface (85) is designed to operate in conjunction with the restriction mechanism. FIG. 10A is a cross-sectional view of the tray (14) taken along line A-A of FIG. 9A. FIG. 10B is a partial enlarged view of FIG. 10A. As shown in the diagrams, the guide surface (85) is defined at the rear end of the guide hole (84). A restriction mechanism (9) schematically shown in FIG. 10B is inserted into the guide hole (84) from the loading interface of the loading apparatus to abut against the guide surface (85). The end of the restriction mechanism (9) comes with a roller adapted to be in contact with the guide surface (85). As shown in FIG. 10B, a slope (851) positioned proximate to the guide hole (84) is defined at the front edge of the guide surface (85) to facilitate an ascent of the roller along the guide surface (85). The restriction mechanism (9) exerts a downward force on the guide surface (85) to allow the tray (14) carrying the casing (11) to be tightly attached to the loading interface of the loading apparatus. The restriction mechanism (9) moves horizontally to exit the guide surface (85) and retreat to the loading interface from the guide hole (84). Even though the roller is in contact with the guide surface (85), the friction between the roller and the guide surface (85) increases with the downward force exerted by the restriction mechanism (9), reducing the ease of movement of the restriction mechanism (9).

Figure 11A:
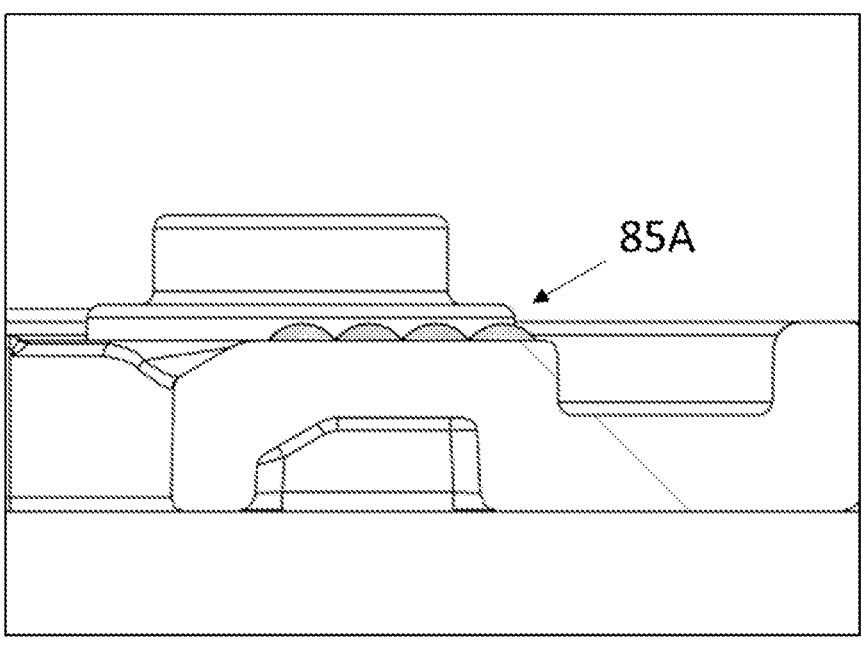
FIG. 11A and FIG. 11B are schematic views of texture according to different embodiments of the disclosure, respectively.
Figure 11B:
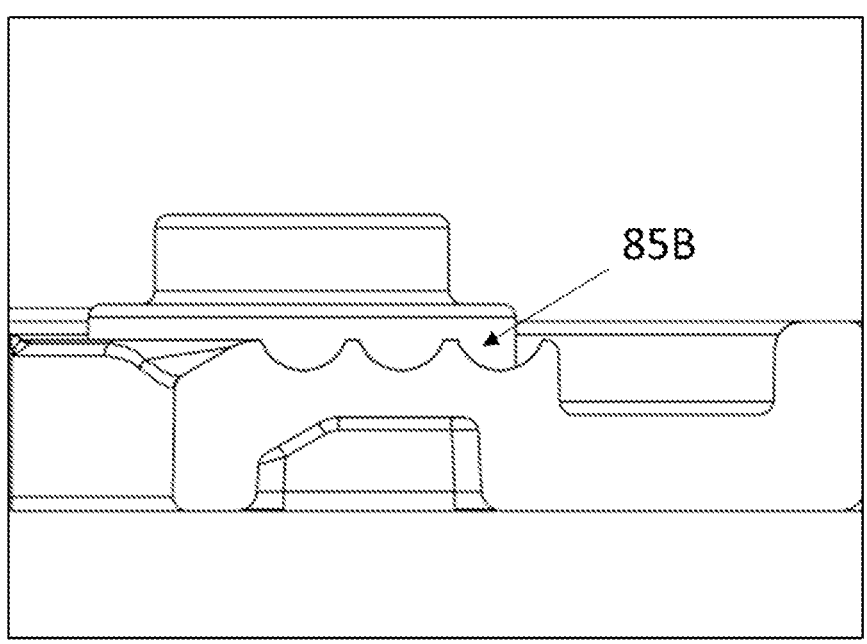

The disclosure provides a technical solution to reducing friction by reducing contact area. The guide surface (85) has a special texture. FIG. 11A and FIG. 11B illustrate different embodiments of the texture, respectively. FIG. 11A shows a guide surface (85A) that is a plane with thereon a plurality of protrusions, for example, round protrusions, slender protrusions or meandering protrusions. FIG. 11B shows a guide surface (85B) that is a plane with thereon a plurality of dents or grooves, for example, round dents or slender grooves.

Thus, the contact area between the roller and the guide surfaces (85A, 85B) is less than the contact area between the roller and the planes to not only effectively reduce the friction between the roller and the guide surfaces (85A, 85B) but also enhance the ease of mechanical interaction between the restriction mechanism (9) and the tray (14). In another embodiment, the texture is defined by a specific roughness or is a rough surface formed by coating a specific material. The texture is a rough surface formed by laser surface treatment, mechanical processing surface treatment or chemical treatment.

Figures 12A, 12B:
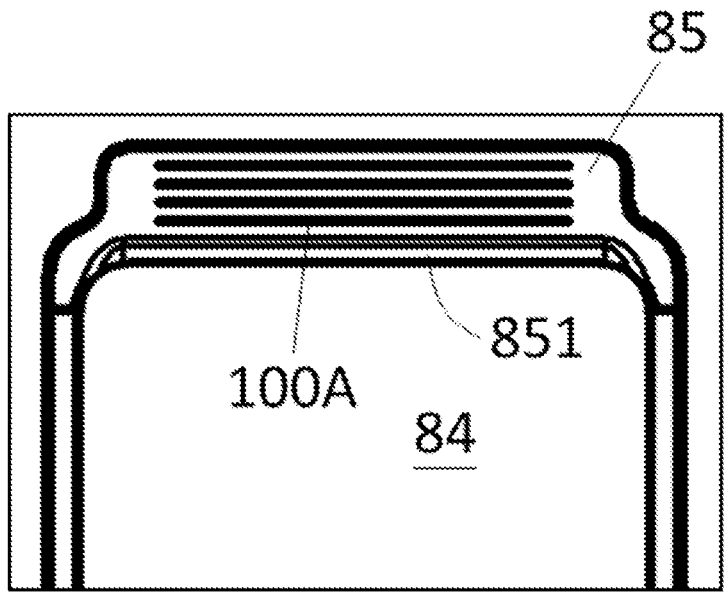
FIG. 12A and FIG. 12B are schematic views of different patterns of the texture of the disclosure, respectively.

FIG. 12A and FIG. 12B are schematic views of different patterns of the texture of the disclosure, respectively. FIG. 12A shows that the pattern of the texture is formed from a plurality of streaks (100A) extending in a lengthwise direction of the guide surface (85). In a variant embodiment, the streaks (100A) extend in a widthwise direction of the guide surface (85) or extend obliquely. The protrusions or dents of the texture are formed according to the distribution of the streaks (100A). FIG. 12B schematically shows that the pattern of the texture consists of a plurality of dots (100B) uniformly distributed on the guide surface (85). In a variant embodiment, the dots (100B) are replaced with squares, triangles, or any other polygons. The protrusions or dents of the texture are formed according to distribution of the dots (100B).

It is noteworthy that specific embodiments of the disclosure merely serve illustrative purposes; thus, various changes can be made to the specific embodiments of the disclosure without departing from the spirit and scope of the claims of the disclosure and shall fall within the scope of the claims of the disclosure. Therefore, the specific embodiments of the disclosure are not restrictive of the disclosure, allowing the spirit and scope of the disclosure to be defined by the appended claims.

What is claimed is:

1. A substrate container, comprising:

a casing having a sidewall; and at least one support connected to the sidewall of the casing and having a plurality of ribs spaced apart from each other, and the plurality of ribs defining a plurality of slots and a carrying plane for receiving a substrate;

wherein the plurality of ribs each has a front end and a rear end, and the rear ends of every adjacent two of the ribs are connected by a closing portion to allow the slots defined by every adjacent two of the ribs to be closed at the rear ends, the closing portion has a concave surface, and a clamping position for restraining the substrate is defined between the concave surface and the carrying plane;

wherein the concave surface at the rear end of the rib and carrying plane are configured to provide a clamping position to hold the substrate, and when the substrate is held at the clamping position, an upper edge of the substrate is restrained by the concave surface while a bottom of the substrate is supported by the carrying plane.

2. The substrate container of claim 1, wherein the clamping position allows the concave surface to restrain upper and lower surfaces of a substrate, and the carrying plane supports a bottom of the substrate, allowing the substrate to be held in place.

3. The substrate container of claim 1, wherein the concave surface is defined by a first slope and a second slope which are linked, wherein the first slope and the second slope define a concave included angle.

4. The substrate container of claim 3, wherein the two adjacent ribs are an upper rib and a lower rib, wherein bottoms of the upper ribs, tops of the lower ribs and the concave surfaces define the slots.

5. The substrate container of claim 4, wherein the bottom of the upper rib has a guide slope, and the guide slope is linked to the first slope of the concave surface of the closing portion.

6. The substrate container of claim 4, wherein the top of the lower rib has a descending slope, and the descending slope connects to the second slope of the concave surface of the closing portion, the descending slope and the second slope define a sink that is below the carrying plane.

* * * * *